(12) United States Patent
Ohmi

(10) Patent No.: US 7,512,168 B2
(45) Date of Patent: Mar. 31, 2009

(54) NITRIDE SEMICONDUCTOR LASER DEVICE AND MANUFACTURING METHOD THEREOF

(75) Inventor: Susumu Ohmi, Kyoto (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 450 days.

(21) Appl. No.: 11/211,544

(22) Filed: Aug. 26, 2005

(65) Prior Publication Data

US 2006/0043409 A1    Mar. 2, 2006

(30) Foreign Application Priority Data

Aug. 27, 2004   (JP)   .............. 2004-247700

(51) Int. Cl.
*H01S 5/00* (2006.01)
*H01S 3/097* (2006.01)

(52) U.S. Cl. ............ 372/46.01; 372/43.01; 372/87

(58) Field of Classification Search ... 372/43.01–46.01, 372/38.05, 87
See application file for complete search history.

(56) References Cited

U.S. PATENT DOCUMENTS

| | | | |
|---|---|---|---|
| 6,278,720 B1 * | 8/2001 | Lee et al. ............... | 372/46.01 |
| 6,583,510 B2 * | 6/2003 | Hanamaki et al. ........... | 257/775 |
| 6,711,192 B1 * | 3/2004 | Chikuma et al. ........ | 372/43.01 |
| 6,984,841 B2 | 1/2006 | Tsuda et al. | |
| 7,187,701 B2 * | 3/2007 | Mihashi et al. .......... | 372/46.01 |
| 2003/0048818 A1 * | 3/2003 | Takeuchi et al. ............. | 372/36 |
| 2003/0165169 A1 * | 9/2003 | Nomoto et al. ............... | 372/46 |
| 2006/0011946 A1 * | 1/2006 | Toda et al. .................. | 257/202 |

FOREIGN PATENT DOCUMENTS

| | | |
|---|---|---|
| JP | 2000-012970 | 1/2000 |
| JP | 2000/058461 | 2/2000 |
| JP | 2003/249463 | 9/2003 |
| JP | 2003-347675 | 12/2003 |

* cited by examiner

*Primary Examiner*—Minsun Harvey
*Assistant Examiner*—Phillip Nguyen
(74) *Attorney, Agent, or Firm*—Harness, Dickey & Pierce

(57) ABSTRACT

A nitride semiconductor laser device of the present invention has an electrical connection point which is provided outside of a pair of trenches in the surface of an upper electrode layer so as to make an electrical connection to the outside. The thickness between the surface of the upper electrode layer and a nitride semiconductor growth layer in the electrical connection point is larger than the thickness between the upper electrode layer and the nitride semiconductor growth layer immediately above a ridge.

10 Claims, 10 Drawing Sheets

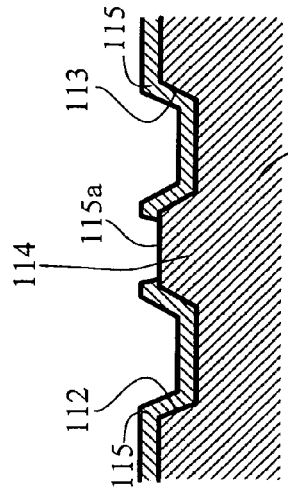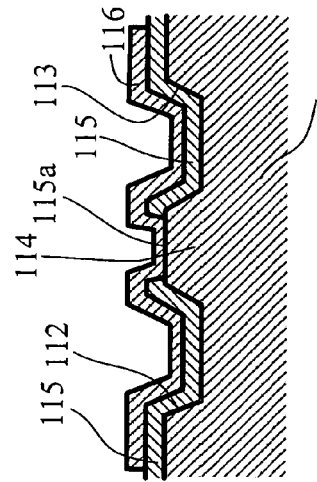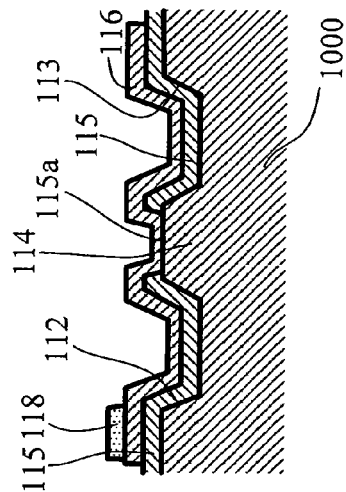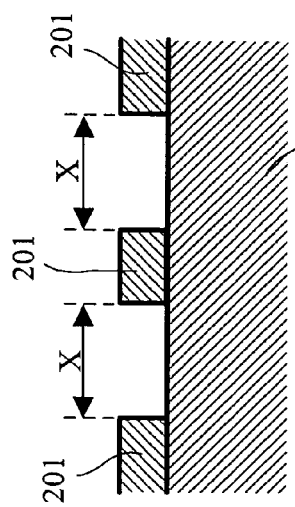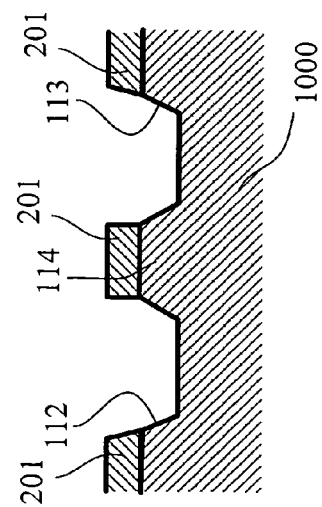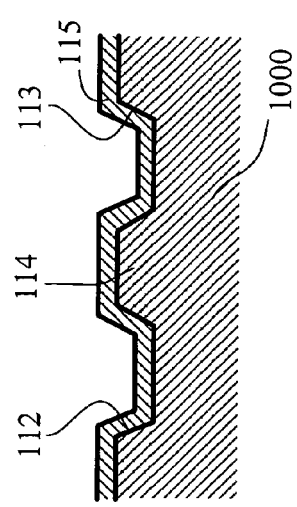

NITRIDE SEMICONDUCTOR LASER DEVICE AND MANUFACTURING METHOD THEREOF

This application is based on Japanese Patent Application No. 2004-247700 filed on Aug. 27, 2004.

BACKGROUND OF THE INVENTION

1. Field of the Invention

The present invention relates to a nitride semiconductor laser device having a ridge stripe structure, and a manufacturing method thereof.

2. Description of the Prior Art

Nitride semiconductor laser devices, where light oscillates in a range from an ultraviolet region to a visible region, are fabricated and manufactured as prototypes with the use of nitride semiconductor materials exemplified by GaN, AlN, InN and mixed crystals thereof. When such nitride semiconductor laser devices are manufactured, a pair of trenches which are parallel to each other are formed in the upper portion of a nitride semiconductor growth layer in a p-side electrode formation region, a ridge is formed at a portion between the pair of trenches and a p-side electrode is formed over the ridge and the pair of trenches in some types of nitride semiconductor lasers having a conventional ridge stripe-type waveguide structure. FIG. 9 shows a schematic cross sectional view of a nitride semiconductor laser device having such a structure.

The nitride semiconductor laser device of FIG. 9 has a configuration in that an undoped GaN buffer layer 2 grown at a low temperature, an undoped GaN layer 3, an n-type GaN contact layer 4, an n-type AlGaN clad layer 5, an n-type GaN optical waveguide layer 6, an InGaN multiple quantum well structure active layer 7, a p-type AlGaN cap layer 8, a p-type GaN optical waveguide layer 9, a p-type AlGaN clad layer 10, and a p-type GaN contact layer 11 are sequentially layered on a sapphire substrate 1 of which the surface is a C surface. The nitride semiconductor laser device includes trenches 12 and 13, a ridge 14, an insulating film 15, openings 15a and 15b, a p-side electrode 16 and an n-side electrode 17.

The upper layer portion of the n-type GaN contact layer 4, the n-type AlGaN clad layer 5, the n-type GaN optical waveguide layer 6, the InGaN multiple quantum well structure active layer 7, the p-type AlGaN cap layer 8, the p-type GaN optical waveguide layer 9, the p-type AlGaN clad layer 10 and the p-type GaN contact layer 11 form a mesa portion in mesa form having a predetermined width. In addition, the trenches 12 and 13 extending linearly in parallel to each other in the direction of a resonator are provided, for example, in the upper layer portion of the p-type AlGaN clad layer 10 and the p-type GaN contact layer 11 in this mesa portion, and the ridge 14 is formed between the trenches 12 and 13.

As shown in FIG. 9, the insulating film 15 made of $SiO_2$ or the like, having a thickness of 300 nm is provided on the surface of the mesa portion and on the surface of the n-type GaN contact layer 4 in the portion other than the mesa portion. The opening 15a is provided in the portion of the insulating film 15 above the ridge 14, and the opening 15b is provided in the portion of the insulating film 15 above the n-type GaN contact layer 4 which is adjacent to the mesa portion. The p-side electrode 16 having a thickness of 410 nm is provided over the ridge 14 and the trenches 12 and 13. Thus, an ohmic contact is made between the p-side electrode 16 and the p-type GaN contact layer 11 of the ridge 14 through the opening 15a provided in the insulating film 15. In addition, the portion of the p-side electrode 16 above the ridge 14 and the portions of the p-side electrode 16 formed on the flat portions except for the trenches 12 and 13 are approximately at the same level in height. Furthermore, the n-side electrode 17 is formed in the opening 15b provided in the insulating film 15; thus, an ohmic contact is made with the n-type GaN contact layer 4.

The nitride semiconductor laser device manufactured in accordance with the aforementioned technique, however, is prone to the following problem. When wire bonding is carried out on the p-side electrode 16 using a wire made of gold or the like, in order to make an electrical connection to the outside, the joint portion between this wire and the p-side electrode 16 is damaged, and a leakage path of a current easily generates in the insulating film 15. This problem becomes more significant in nitride semiconductor laser devices made of gallium-based compounds. This problem will be described in detail by way of examples.

In order to confirm the aforementioned problem, a nitride semiconductor laser is fabricated in such a manner that the structure in which the opening 15a is not provided in the insulator 15 immediately above the ridge 14 has been modified from the nitride semiconductor laser device having the conventional structure shown in FIG. 9. As a result, no portion of the p-side electrode 16 makes direct electrical contact with the p-type GaN contact layer 11 in this nitride semiconductor laser device. FIG. 10 shows the current-voltage characteristics of the nitride semiconductor laser device when a voltage is applied thereto in the forward direction through the p-side electrode 16 and the n-side electrode 17 via gold wires joined to these electrodes in accordance with a ball bonding method where an end portion of a gold wire is fused by means of arc discharge into ball form, to which ultrasonic waves are applied so that the end portion of the gold wire is joined to an electrode. Here, the insulating film 15 is made of $SiO_2$ and has a thickness of 350 nm. In addition, the p-side electrode 16 has a two layer structure where a Pd layer having a thickness of 15 nm and an Au layer having a thickness of 200 nm are sequentially layered in this order starting from the p-type GaN contact layer 11 side.

Although the entirety of the p-side electrode 16 is provided on the insulating film 15 in such a manner that no portion thereof makes direct electrical contact with the p-type GaN contact layer 11, as is clear from FIG. 10, a current starts flowing in the vicinity where the applied voltage value exceeds 3 V and a leak current of which the value is close to 10 mA flows when the applied voltage value is 6 V.

The aforementioned phenomenon strongly depends on the conditions when a gold wire is joined to the top of the p-side electrode 16 using a ball bonding method. That is, the period of time for applying ultrasonic waves is made long and the output of the ultrasonic waves is enhanced in order to strengthen the joint between the p-side electrode and the gold wire. When the period of time for applying ultrasonic waves is made long or the output of the ultrasonic waves is enhanced in this manner, however, a leak current tends to flow easily. In contrast, it has been found that in the case where the insulating film 15 is formed so as to have a thickness as large as, for example, approximately 800 nm or the p-side electrode 16 is formed so as to have a thickness as large as, for example, approximately 600 nm, a leak current can be suppressed.

If the insulating film 15 is formed so as to have a thickness of, for example, 800 nm in order to suppress the leak current in the aforementioned phenomenon, however, it becomes very difficult to provide the opening 15a. In the case where the opening 15a is formed in the insulating film 15 in accordance with a conventional method, a resist pattern having an opening is formed and the portion of the insulating film 15 of which the surface is exposed from this opening is removed using a wet etching method until the p-type GaN contact layer 11, which is the base, is exposed. In the case where the wet etching method is used, however, etching progresses isotropically in the lateral direction in addition to in the depth direction.

In such a case, etching progresses 800 nm in the depth direction and, also, etching progresses in the lateral direction, resulting in the progress of etching of 800 nm each on the right and left side, approximately 1.6 μm or more. However, the width of the ridge 14 is usually in a range from approximately 1.4 μm to 3.0 μm. Therefore, the possibility is high where the width of the opening 15a formed in accordance with a wet etching method becomes wider than the width of the ridge 14. Meanwhile, if a dry etching method is used, anisotropic etching becomes possible and etching in the lateral direction is prevented. However, at the same time, there is a risk that the p-type GaN contact layer 11 may be damaged by ion impact and the like.

In addition, also in the case where the p-side electrode 16 is formed so as to have a thickness as large as, for example, approximately 600 nm, influences of the distortion caused by the difference in the thermal expansion coefficients between the material of the p-side electrode 16 and the gallium nitride-based compound constituting the ridge 14 cannot be ignored; therefore, there is a risk that the InGaN multiple quantum well structure active layer 7 may be adversely affected.

SUMMARY OF THE INVENTION

In view of the aforementioned problems, an object of the present invention is to provide a highly reliable nitride semiconductor laser device where damage is prevented from occurring in the joint portion between a wire and an upper electrode formed on a nitride semiconductor growth layer and no leakage path of a current is generated even in the case where wire bonding is carried out on the upper electrode using a wire made of gold or the like in order to make the upper electrode electrically connected to the outside, as well as to provide a manufacturing method thereof.

In order to achieve the aforementioned object, the present invention provides a nitride semiconductor laser device comprising: a substrate; a nitride semiconductor growth layer having a plurality of nitride semiconductor layers layered on the substrate; a pair of trenches in the surface of the nitride semiconductor growth layer; a ridge interposed between the pair of trenches and provided with an opening; an insulator film formed on the surface of the nitride semiconductor growth layer except for the ridge; and an upper electrode layer formed over the surfaces of the insulator film and the ridge, wherein an electrical contact point is provided outside of the pair of trenches on the surface of the upper electrode layer so as to make an electrical connection to the outside, and the thickness between the surface of the upper electrode layer in the electrical contact point and the nitride semiconductor growth layer is larger than the thickness between the upper electrode layer immediately above the ridge and the nitride semiconductor growth layer.

The present invention also provides a manufacturing method of a nitride semiconductor laser device, comprising: a first step of forming a pair of trenches in the surface of a nitride semiconductor growth layer having a plurality of nitride semiconductor layers layered on a substrate, and a ridge interposed between the pair of trenches; a second step of forming an insulator film on the surface of the nitride semiconductor growth layer where the pair of trenches and the ridge are formed; a third step of removing the insulator film layered on the ridge to form an opening; a fourth step of forming an upper electrode layer over the surfaces of the insulator film and the opening; and a fifth step of providing an electrical contact point outside of the pair of trenches in the surface of the upper electrode layer so as to make an electrical connection to the outside, wherein the insulator film and the upper electrode layer are formed in such a manner that the thickness between the surface of the upper electrode layer in the electrical contact point and the nitride semiconductor growth layer is larger than the thickness between the upper electrode layer immediately above the ridge and the nitride semiconductor growth layer.

The present invention also provides a manufacturing method of a nitride semiconductor laser device which comprises a substrate, a nitride semiconductor growth layer having a plurality of nitride semiconductor layers layered on the substrate, a pair of trenches in the surface of the nitride semiconductor growth layer, and a ridge interposed between the pair of trenches, the method comprising: a first step of providing a first upper electrode layer on the surface of the nitride semiconductor growth layer in a region where the ridge is to be formed and, also, forming a first insulator film in a region which is at least a part of a region outside of the region where the pair of trenches are to be formed; a second step of forming a resist pattern in stripe form on the surface of the first upper electrode layer and, also, forming the pair of trenches and the ridge using the resist pattern and the first insulator film as a part of a mask; a third step of forming a second insulator film over the surface of the first insulator film and the surface of the nitride semiconductor growth layer including the surface of the resist pattern used as a mask upon formation of the ridge in the second step and, also, removing the resist pattern immediately above the ridge together with the second insulator film formed on the resist pattern, thereby forming an opening; a fourth step of forming a second upper electrode layer over the surfaces of the second insulator film and the ridge; and a fifth step of providing an electrical contact point outside of the pair of trenches in the surface of the second upper electrode layer so as to make an electrical connection to the outside, wherein the thickness between the surface of the second upper electrode layer in the electrical contact point and the nitride semiconductor growth layer is larger than the thickness between the second upper electrode layer immediately above the ridge and the nitride semiconductor growth layer.

DESCRIPTION OF THE DRAWINGS

FIGS. 5a to 5f are schematic cross sectional views illustrating a manufacturing method of a part of the nitride semiconductor laser device according to the first embodiment of the present invention;

DESCRIPTION OF THE PREFERRED EMBODIMENTS

First Embodiment

Figure 1:
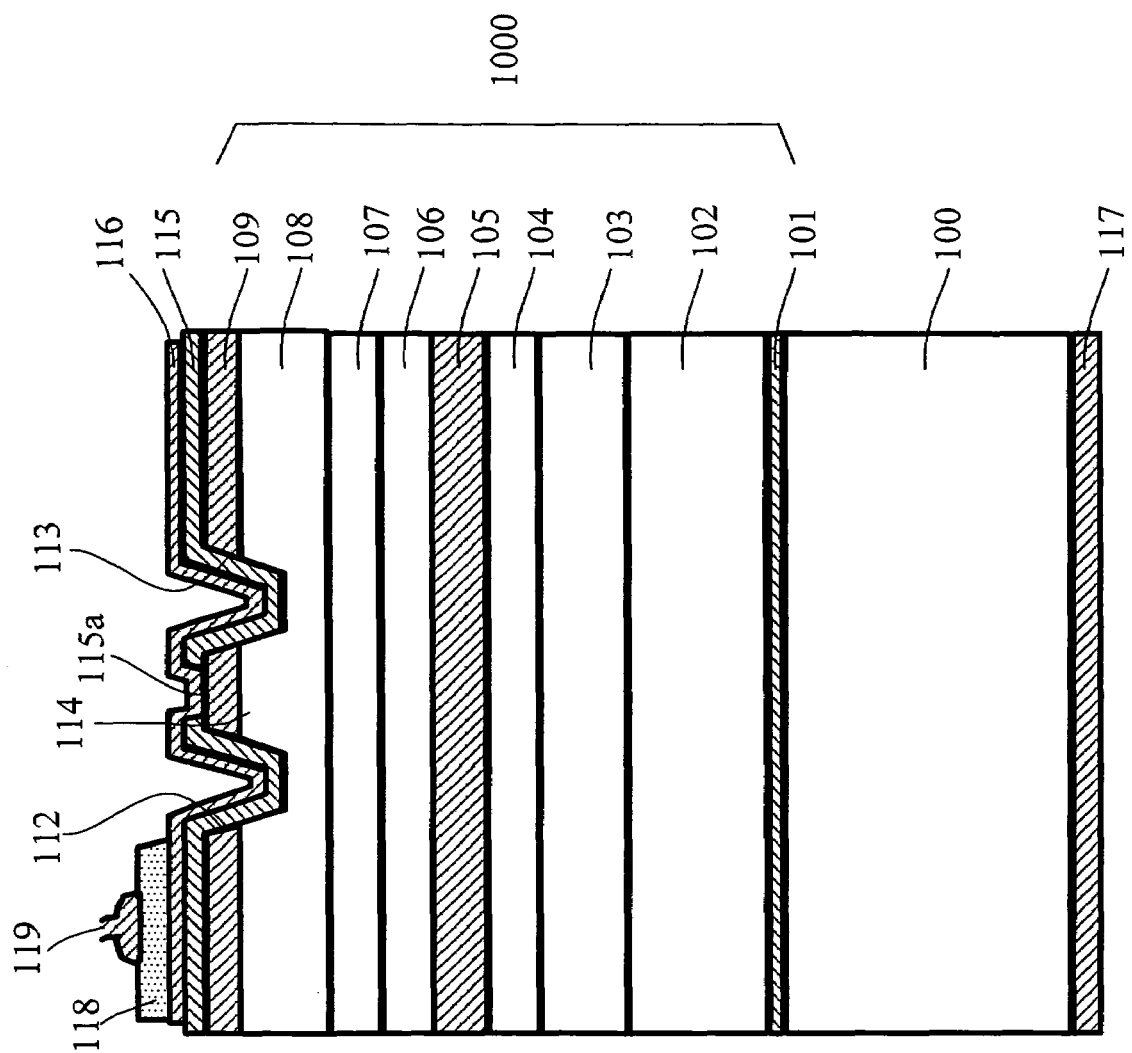
FIG. 1 is a schematic cross sectional view showing the configuration of a nitride semiconductor laser device according to a first embodiment of the present invention.

A first embodiment of the present invention will be described with reference to the drawings. FIG. 1 is a schematic cross sectional view showing the structure of a nitride semiconductor laser device according to this embodiment.

The nitride semiconductor laser device of FIG. 1 includes a nitride semiconductor growth layer 1000 having a configuration in that an Si doped GaN buffer layer 101 which is grown at a low temperature and has a thickness of 40 nm, an n-type GaN layer 102 having a thickness of 4 µm, an n-type AlGaN clad layer 103 having a thickness of 1.3 µm, an n-type GaN optical waveguide layer 104 having a thickness of 0.1 µm, an InGaN multiple quantum well structure active layer 105 having a total thickness of 30 nm, a p-type AlGaN cap layer 106 having a thickness of 15 nm, a p-type GaN optical waveguide layer 107 having a thickness of 0.1 µm, a p-type AlGaN clad layer 108 having a thickness of 1.3 µm, and a p-type GaN contact layer 109 having a thickness of 0.8 µm are sequentially layered on an n-type GaN substrate 100. The nitride semiconductor laser device also includes trenches 112 and 113 each having a width of 30 µm, a ridge 114 having a width of 3 µm, an insulating film 115 which is made of SiO$_2$ and has a thickness of 350 nm, an opening 115a having a width of 1.5 µm, a first p-side electrode 116, an n-side electrode 117, a second p-side electrode 118 and a gold wire 119.

The trenches 112 and 113 are provided in the upper layer portion of the p-type AlGaN clad layer 108 and the p-type GaN contact layer 109 so as to extend linearly in parallel to each other in the direction of [1-100] (not shown) of the nitride semiconductor layer, and the ridge 114 is formed between the trenches 112 and 113. The insulating film made of SiO$_2$ is formed on the surface of the trenches 112 and 113, the ridge 114 and of the portions of the p-type GaN conductor layer 109 other than the trenches 112 and 113 and the ridge 114, and the opening 115a is formed in the insulating film 115 above the ridge 114.

Starting from the nitride semiconductor growth layer 1000 side, Pd (layer thickness: 20 nm) and Au (layer thickness: 150 nm) are sequentially evaporated on the surfaces of the insulating film 115 and the opening 115a formed as described above over the ridge 114 and the trenches 112 and 113, so that the first p-side electrode 116 is formed. In addition, the p-type GaN contact layer 109 and the first p-side electrode 116 in the ridge 114 make an ohmic contact through the opening 115a in the insulating film 115.

In addition, the second p-side electrode 118 which is made of Au and has a thickness of 600 nm is provided on the surface of the first p-side electrode 116 formed on the side opposite to the ridge 114 relative to the trench 112. Furthermore, the gold wire 119 is connected to the top of the second p-side electrode 118. In addition, starting from the n-type GaN substrate 100 side, Ti (layer thickness: 25 nm) and Al (layer thickness: 150 nm) are sequentially evaporated on the rear surface of the n-type GaN substrate 100, so that the n-side electrode 117 is formed.

Hereinafter, a fabricating method of a nitride semiconductor laser device will be described with reference to the drawings. FIGS. 5a to 5f are schematic cross sectional views showing a manufacturing method of the nitride semiconductor laser device according to this embodiment.

First, the nitride semiconductor growth layer 1000 having a layered structure as shown in FIG. 1 is formed on the n-type GaN substrate 100 appropriately using a known process which is generally used for the manufacturing of nitride semiconductor devices, such as an MOCVD (Metal Organic Chemical Vapor Deposition) method or an MBE (Molecular Beam Epitaxy) method.

After a wafer where the nitride semiconductor growth layer 1000 is formed on the n-type GaN substrate 100 is fabricated as described above, next, as shown in FIG. 5a, a photoresist pattern, which is formed of a photoresist mask 201 in stripe form having a width of 3 µm with the width X of the openings in the resistor being 30 µm, is formed on the surface of the nitride semiconductor growth layer 1000. Next, as shown in FIG. 5b, etching is carried out on the nitride semiconductor growth layer 1000 as deep as the middle of the p-type AlGaN clad layer 108 in accordance with an RIE (Reactive Ion Etching) technique using the formed photoresist mask 201, so that the trenches 112 and 113 and the ridge 114 are formed. Here, chlorine-based gas such as Cl$_2$, SiCl$_4$ or BCl$_3$ may be used as process gas for the etching.

Subsequently, the photoresist mask 201 is separated and removed with an organic solvent and, thereafter, as shown in FIG. 5c, the insulating film 115 which is made of SiO$_2$ and has a thickness of 350 nm is formed in accordance with an electron beam deposition method. Next, as shown in FIG. 5d, the opening 115a having a width of 1.5 µm is provided in the insulating film 115 above the ridge 114 using a conventional photolithographic technique and a wet etching technique with HF (hydrogen fluoride acid).

Next, as shown in FIG. 5e, starting from the nitride semiconductor growth layer 1000 side, Pd (layer thickness: 20 nm) and Au (layer thickness: 150 nm) are sequentially evaporated in accordance with an electron beam evaporation method over the ridge 114 and the trenches 112 and 113. As described above, the first p-side electrode 116 is formed on the nitride semiconductor growth layer 1000 in the ridge 114 and on the surface of the insulating film 115. Furthermore, the second p-side electrode 118 which is made of Au and has a thickness of 600 nm is formed on the first p-side electrode 116 on the side opposite to the ridge 114 relative to the trench 112; thus, the form shown in FIG. 5f is obtained.

In the case where the first p-side electrode 116 is formed only in a specific portion as shown in FIG. 5e, first, a resist pattern with an opening for the region where the first p-side electrode 116 is to be formed is formed using a photolithographic technique before vapor deposition. Subsequently, Pd and Au are sequentially evaporated on the entirety of the surface of the wafer as described above in the state where the resist pattern remains. After the vapor deposition, Pd and Au evaporated on the resist pattern are removed together with the resist pattern by means of lift off. As a result, Pd and Au remain in the opening, and the first p-side electrode 116 in a form as shown in FIG. 5e is obtained.

Similarly, in the case where the second p-side electrode 118 is formed only in the specific portion as shown in FIG. 5f, first, a resist pattern with an opening for the region where the second p-side electrode 118 is to be formed is formed using a photolithographic technique before vapor deposition. Subsequently, Au is evaporated on the entirety of the surface of the wafer as described above in the state where the resist pattern remains. After the vapor deposition, Au evaporated on the resist pattern is removed together with the resist pattern by means of lift off. As a result, Au remain in the opening, and the second p-side electrode 118 in a form as shown in FIG. 5f is obtained.

Grinding and polishing is carried out on the rear surface of the n-type GaN substrate 100 of the wafer obtained as described above until the thickness of the wafer becomes approximately 80 µm. Next, starting from the substrate side, Ti (layer thickness: 25 nm) and Al (layer thickness: 150 nm) sequentially evaporated in accordance with an electron beam evaporation method on the rear surface of the n-type GaN substrate 100 so as to form the n-side electrode 117. Thereafter, the gold wire 119 is connected to the top of the second p-side electrode 118; thus, the nitride semiconductor laser device of FIG. 1 is obtained.

In this embodiment, the total thickness of the first p-side electrode 116 and the second p-side electrode 118, which are formed beneath where the gold wire 119 is connected, becomes 770 nm. Therefore, in the case where wire bonding or the like is carried out on the surface of the second p-side electrode 118 using a gold wire in order to obtain an electrical connection to the outside, damage caused by joining the gold wire 119 to the second p-side electrode 118 does not affect the insulating film 115. Accordingly, no leakage path of a current is generated in the insulating film 115 and a highly reliable nitride semiconductor laser device can be obtained.

Here, though in this embodiment, as describe above, the second p-side electrode 118 is formed in the region on the side opposite to the ridge 114 relative the trench 112 as shown in FIG. 1; however, the present invention is not limited thereto. That is, as shown in FIG. 8, the second p-side electrode 118 may also be provided in the region on the side opposite to the ridge 114 relative to the trench 113, and the second p-side electrode 118 may be formed on the surface of the first p-side electrode 116 on both the left and right sides, which are symmetrical relative to the ridge 114.

Figure 8:
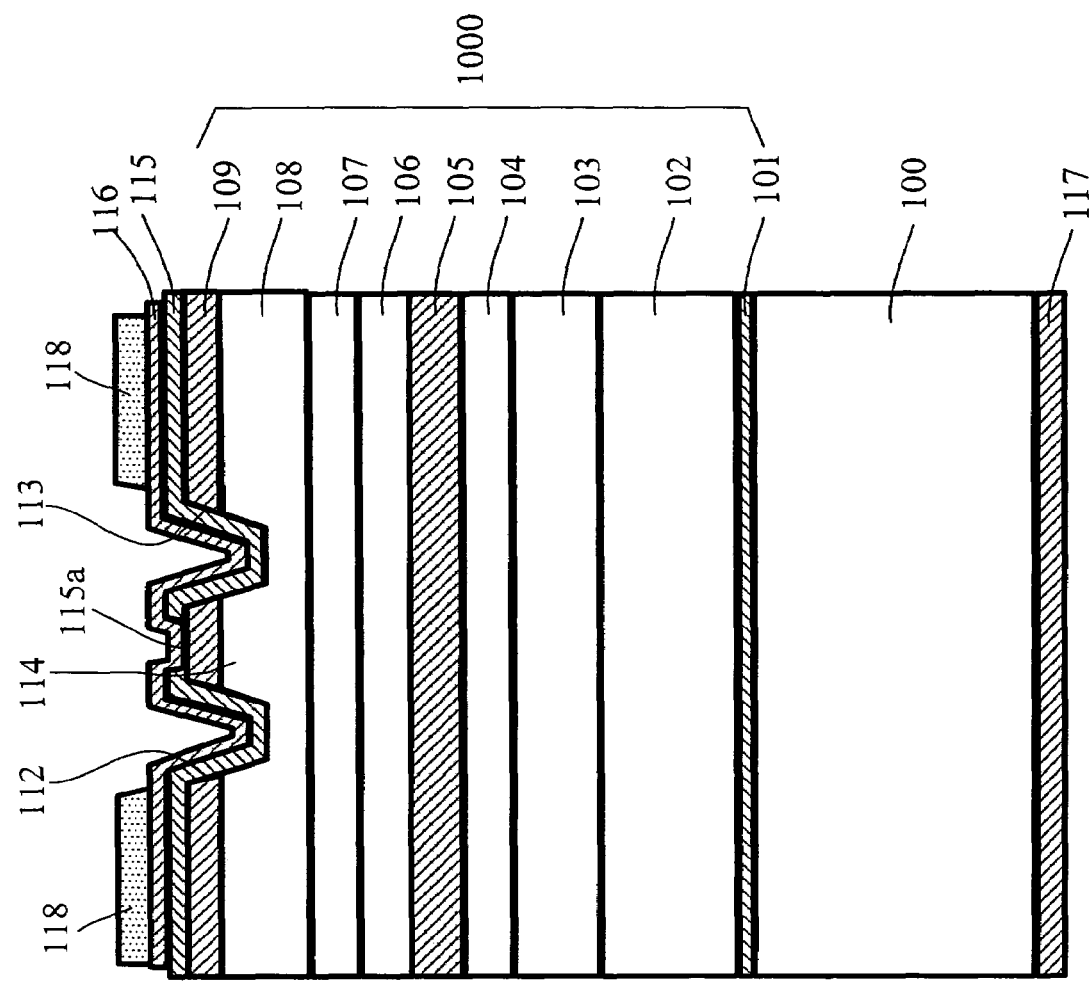
FIG. 8 is a schematic cross sectional view showing the configuration of a modification of the nitride semiconductor laser device according to the first embodiment of the present invention.
Figure 9:
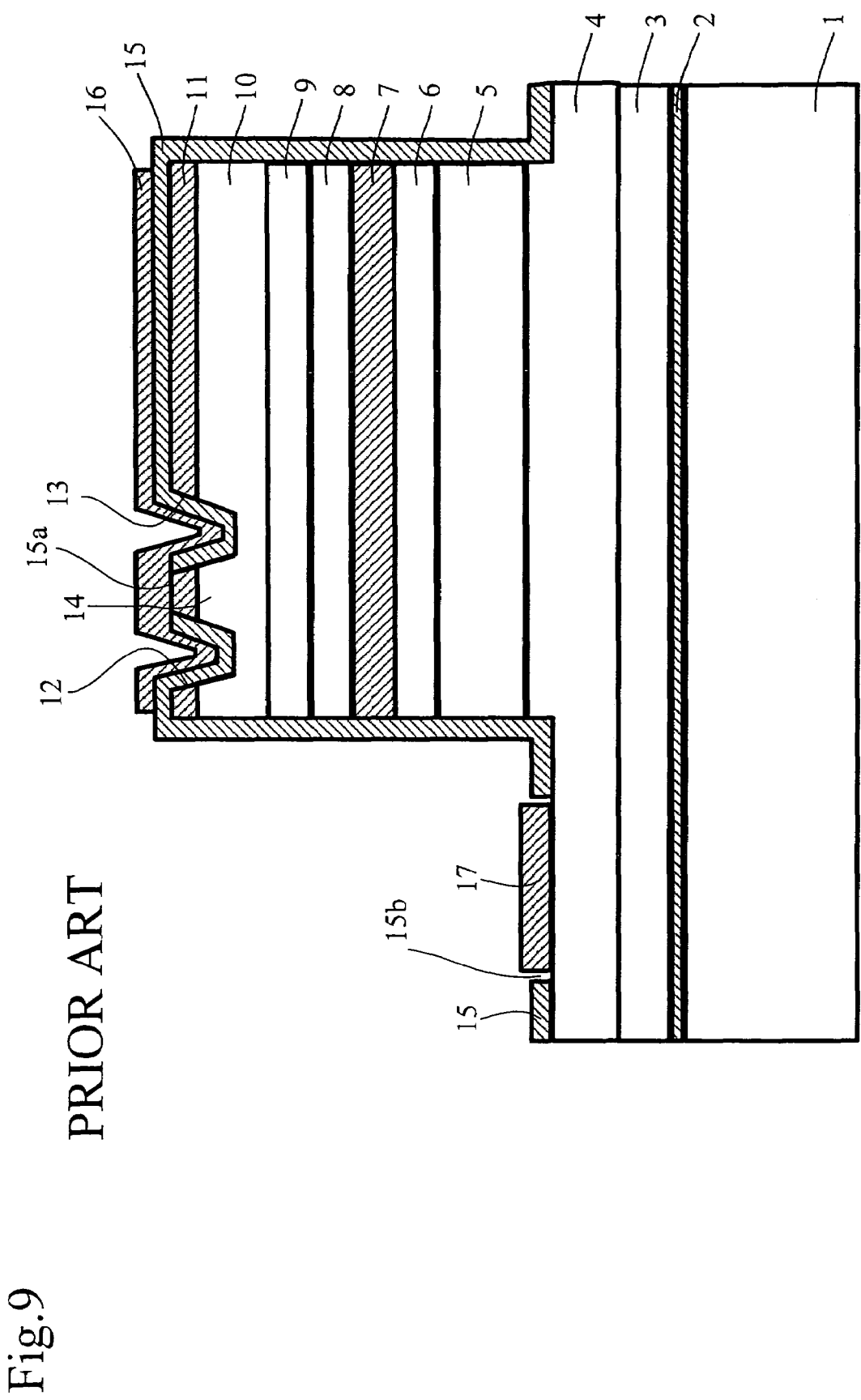
FIG. 9 is a schematic cross sectional view showing the configuration of a nitride semiconductor laser device according to the conventional art.
Figure 10:
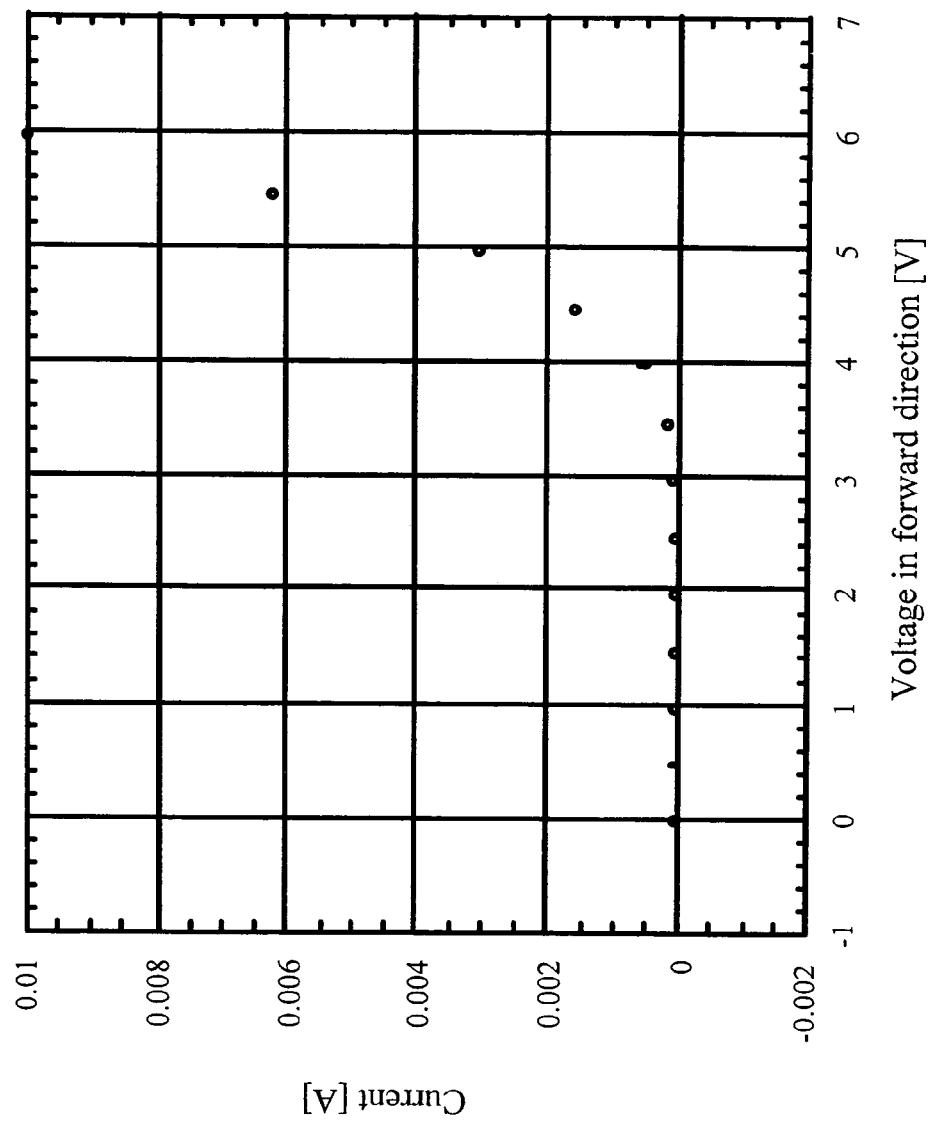
FIG. 10 is a graph showing the current-voltage characteristics of a nitride semiconductor laser device manufactured in accordance with the conventional art.

It is possible for the nitride semiconductor laser device having a structure shown in FIG. 8, unlike the nitride semiconductor laser device having the structure shown in FIG. 1 which is electrically connected to the outside via a gold wire, to be electrically connected to the outside by making the second p-side electrode 118 face a submount or the like and joining the second p-side electrode 118 to the submount or the like. In the packaging process of joining this nitride semiconductor laser device to the submount or the like, the second p-side electrodes 118 become equal in height on the left and right sides of the ridge 114 in the nitride semiconductor laser device having the structure shown in FIG. 8. Therefore, this nitride semiconductor laser device can be prevented from being inclined after being joined to the submount or the like. In addition, the second p-side electrode 118 can suppress damage at the time of being joined and prevent the generation of a leakage path of a current from being caused by such damage.

Second Embodiment

Figure 2:
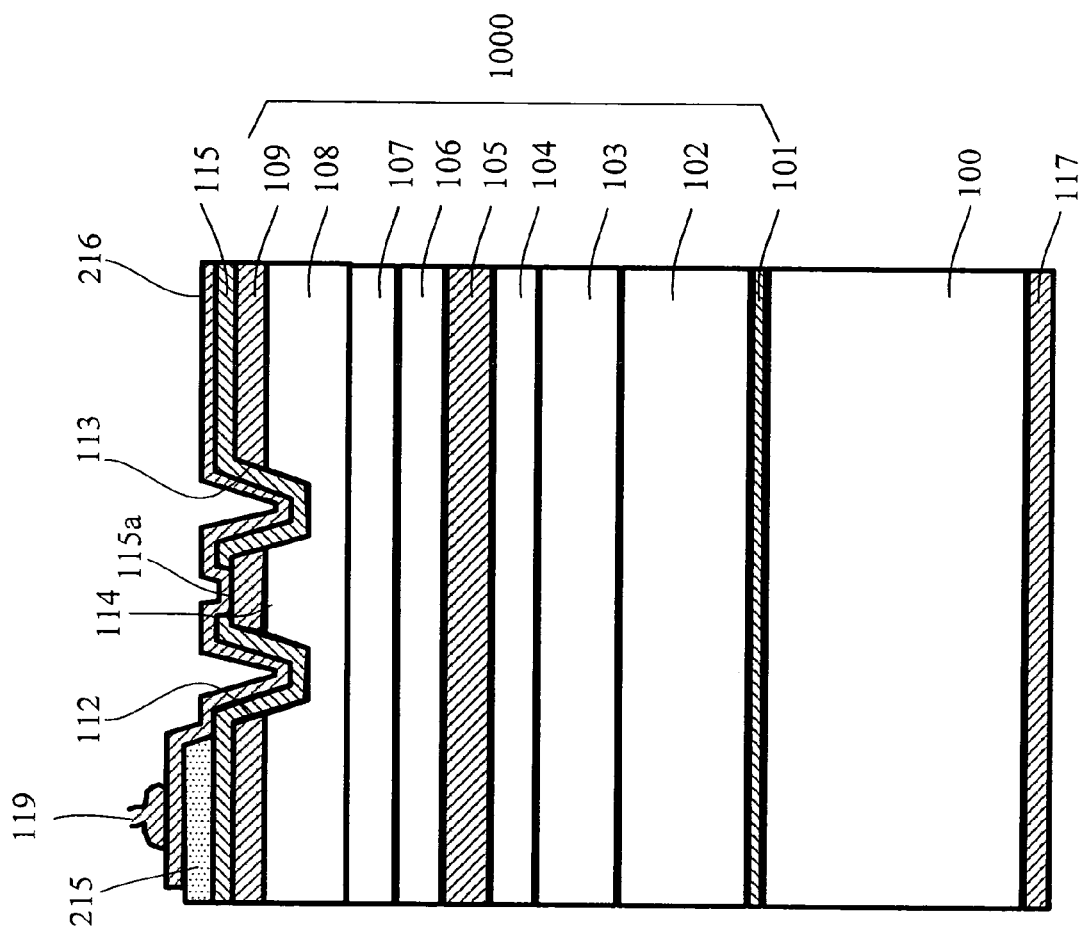
FIG. 2 is a schematic cross sectional view showing the configuration of a nitride semiconductor laser device according to a second embodiment of the present invention.

A second embodiment of the present invention will be described below with reference to the drawings. FIG. 2 is a schematic cross sectional view showing the structure of a nitride semiconductor laser device according to this embodiment. Here, the configuration of the nitride semiconductor growth layer 1000, which is layered on the n-type GaN substrate 100, according to this embodiment is the same as that in the first embodiment; therefore, the detailed description thereof will not be given and the first embodiment should be referred to if necessary.

The nitride semiconductor laser device of FIG. 2 has a nitride semiconductor growth layer 1000 formed on an n-type GaN substrate 100 in the same manner as that in the first embodiment. The nitride semiconductor laser device also includes trenches 112 and 113 each having a width of 30 µm, a ridge 114 having a width of 3 µm, an insulating film 115 which is made of $SiO_2$ and has a thickness of 350 nm, opening 115a having a width of 1.5 µm, a p-side electrode 216, an n-side electrode 117, a gold wire 119 and a second insulating film 215 which is made of $SiO_2$ and has a thickness of 700 nm.

In the same manner as in the first embodiment, the trenches 112 and 113 are provided in the upper layer portion of the p-type AlGaN clad layer 108 and in the p-type GaN contact layer 109 so as to extend linearly in parallel to each other in the direction of [1-100] of the nitride semiconductor layer, and the ridge 114 is formed between the trenches 112 and 113. The insulating film 115 made of $SiO_2$ is formed on the surface of the trenches 112 and 113, the ridge 114 and of the portions of the p-type GaN contact layer 109 other than the trenches 112 and 113 and the ridge 114. In addition, the opening 115a is formed in the insulating film 115 above the ridge 114.

Thus, unlike the first embodiment, the second insulating film 215 which is made of $SiO_2$ and has a thickness of 700 nm is provided on the surface of the insulating film 115 formed on the side opposite to the ridge 114 relative to the trench 112.

Starting from the nitride semiconductor growth layer 1000 side, Pd (layer thickness: 20 nm) and Au (layer thickness: 150 nm) are sequentially evaporated on the surfaces of the insulating film 115, the opening 115a and the second insulating film 215, which have been formed as described above, over the ridge 114 and the trenches 112 and 113, so that the p-side electrode 216 is formed. In addition, the p-type GaN contact layer 109 and the p-side electrode 216 in the ridge 114 make an ohmic contact through the opening 115a in the insulating film 115. Furthermore, the gold wire 119 is connected to the top of the p-side electrode 216 formed immediately above the second insulating film 215. In addition, starting from the n-type GaN substrate 100 side, Ti (layer thickness: 25 nm) and Al (layer thickness: 150 nm) are sequentially evaporated on the rear surface of the n-type GaN substrate 100, so that the n-side electrode 117 is formed.

In a manufacturing method of the nitride semiconductor laser device according to this embodiment, the steps up to the formation of the opening 115a in the insulating film 115 are the same as those in the manufacturing method of the nitride semiconductor laser according to the first embodiment described with reference to FIGS. 5a to 5d; therefore, the detailed descriptions thereof will not be given and the first embodiment should be referred to if necessary. Then, after the opening 115a is formed in the insulating film 115 as shown in FIG. 5d, an insulating film which is made of $SiO_2$ and has a thickness of 700 nm is deposited on the surface of the insulating film 115 which is on the side opposite to the ridge 114 relative to the trench 112 in accordance with an electron beam evaporation method, unlike the first embodiment, and the second insulating film 215 is formed using a conventional photolithographic technique and a wet etching technique with HF. Next, starting from the nitride semiconductor growth layer 1000 side, Pd (layer thickness: 20 nm) and Au (layer thickness: 150 nm) are sequentially evaporated in accordance with an electron beam method on the surfaces of the insulating film 115, the opening 115a and the second insulating film 215 over the ridge 114 and the trenches 112 and 113, so that the p-side electrode 216 is formed.

Grinding and polishing is carried out on the rear surface of the n-type GaN substrate 100 of the wafer obtained as described above, until the thickness of the wafer becomes approximately 80 μm. Next, starting from the substrate side, Ti (layer thickness: 25 nm) and Al (layer thickness: 150 nm) are sequentially evaporated on the rear surface of the n-type GaN substrate 100, and the n-type electrode 117 is formed; thus, the nitride semiconductor laser device of FIG. 2 is obtained.

According to this embodiment, the second insulating film 215 which is made of $SiO_2$ and has a thickness of 700 nm is provided immediately beneath the gold wire 119, so that damage caused by carrying out wire bonding or the like on the surface of the p-side electrode 216 so as to join the gold wire 119 to the p-side electrode 216 is absorbed by the second insulating film 215. Accordingly, damage is prevented from reaching the insulating film 115 and thus a highly reliable nitride semiconductor laser device where no leakage path of a current is generated in the insulating film 115 can be obtained. Here, in the same manner as in the configuration of FIG. 8 according to the first embodiment, the second insulating film 215 may be formed on both the left and right sides which are symmetrical relative to the ridge 114.

According to this embodiment, the second insulating film 215 is formed instead of the second p-side electrode 118 of the first embodiment, so that the generation of a leakage path of a current is suppressed. Therefore, in the case where wire boding is carried out to achieve an electrical joint to the outside, with reference to the thickness of the metal layer in the position where the bonding is carried out, the thickness of the p-side electrode joined to the gold wire 119 can be reduced in comparison with the first embodiment. Accordingly, when the gold wire 119 is joined to the p-side electrode 216, ultrasonic energy can sufficiently be applied to the joint portion, thereby preventing the joint from losing strength.

Third Embodiment

Figure 3:
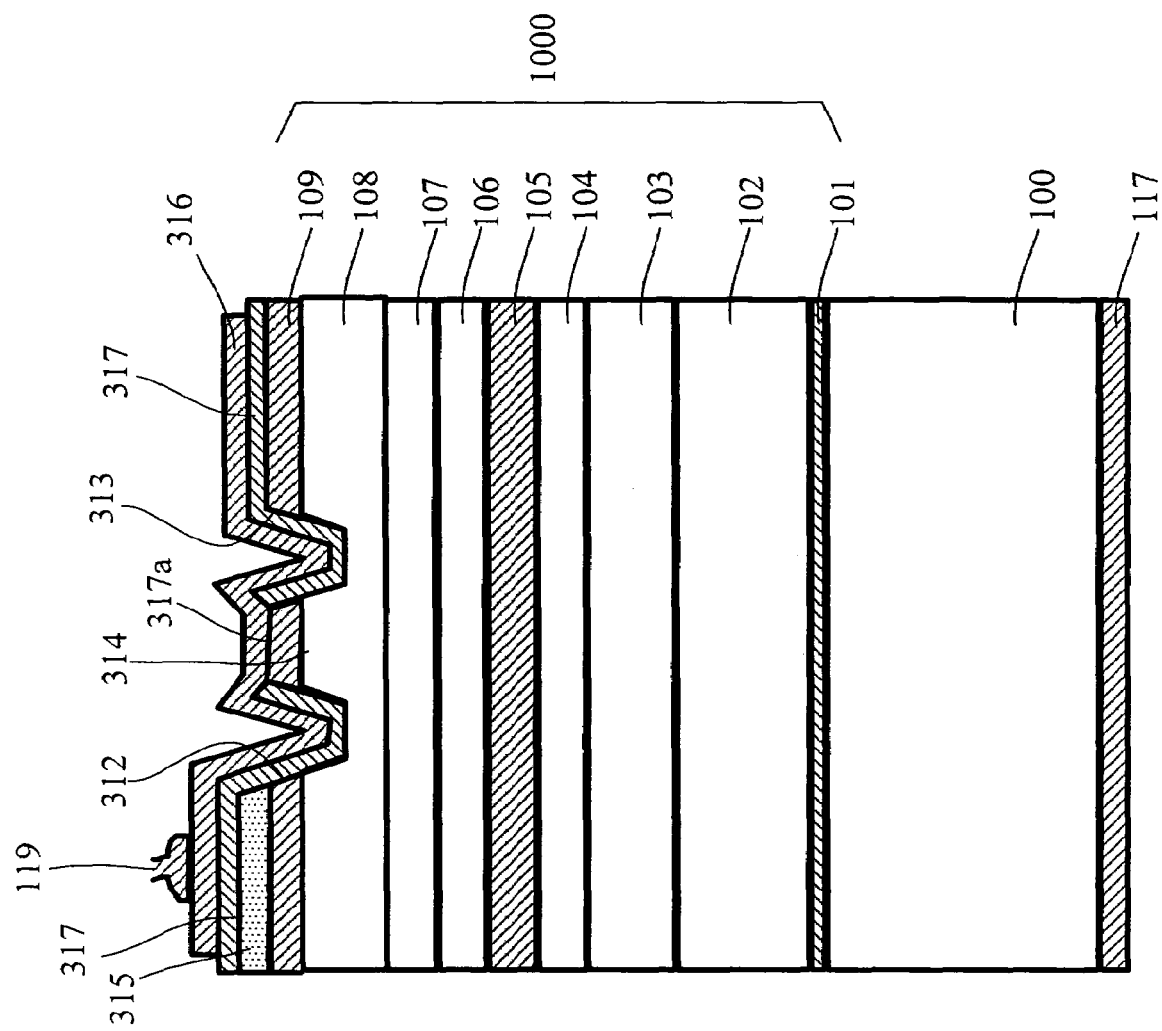
FIG. 3 is a schematic cross sectional view showing the configuration of a nitride semiconductor laser device according to a third embodiment of the present invention.

A third embodiment of the present invention will be described below with reference to the drawings. FIG. 3 is a schematic cross sectional view showing the structure of a nitride semiconductor laser device according to this embodiment. Here, the configuration of a nitride semiconductor growth layer 1000 layered on an n-type GaN substrate 100 according this embodiment is the same as that in the first embodiment; therefore, the detailed description thereof will not be given and the first embodiment should be referred to if necessary.

The nitride semiconductor laser device of FIG. 3 has the nitride semiconductor growth layer 1000 formed on the n-type GaN substrate 100 in the same manner as that in the first embodiment. The nitride semiconductor device also includes trenches 312 and 313 having a width of 35 μm, a ridge 314 having a width of 1.5 μm, a first insulating film 315 which is made of $SiO_2$ and has a thickness of 600 nm, a p-side electrode 316, a second insulating film 317 which is made of $SiO_2$ and has a thickness of 350 nm, an opening 317a having a width of 1.5 μm, an n-side electrode 117 and a gold wire 119.

In this structure, the trenches 312 and 313 are provided in the upper layer portion of the p-type AlGaN clad layer 108 and in the p-type GaN contact layer 109 so as to extend linearly in parallel to each other in the direction of [1-100] of the nitride semiconductor layer, and the ridge 314 is formed between the trenches 312 and 313. The first insulating film 315 made of $SiO_2$ is provided on the surface of the nitride semiconductor growth layer 1000 on the side opposite to the ridge 314 relative to the trench 312. In addition, the second insulating film 317 made of $SiO_2$ is formed on the surface of the trenches 312 and 313, the ridge 314, the first insulating film 315 and of the portions of the p-type GaN contact layer 109 other than the trenches 312 and 313, the ridge 314 and the first insulating film 315. In addition, the opening 317a is provided in this second insulating film 317 above of the ridge 314.

Starting from the nitride semiconductor growth layer 1000 side, Pd (layer thickness: 20 nm) and Au (layer thickness: 150 nm) are sequentially evaporated on the surfaces of the second insulating film 317 and the opening 317a over the aforementioned ridge 314 and the trenches 312 and 313, and the p-side electrode 316 is formed, which makes an ohmic contact with the p-type GaN contact layer 109 of the ridge 314 through the opening 317a in the second insulating film 317. Furthermore, the gold wire 119 is connected to the top of the p-side electrode 316 formed immediately above the first insulating film 315. In addition, starting from the n-type GaN substrate 100 side, Ti (layer thickness: 25 nm) and Al (layer thickness: 150 nm) are sequentially evaporated on the rear surface of the n-type GaN substrate 100, so that the n-side electrode 117 is formed. Here, the first insulating film 315 may be formed on both the left and right sides which are symmetrical relative to the ridge 314.

Hereinafter, a fabricating method of a nitride semiconductor laser device will be described with reference to the drawings. FIGS. 6a to 6e are schematic cross sectional views showing a manufacturing method of the nitride semiconductor laser device according to this embodiment. Here, in the following description, the first insulating film 315 is formed on both the left and right sides which are symmetrical relative to the ridge 314.

First, the nitride semiconductor growth layer 1000 is layered on the n-type GaN substrate 100 in the same manner as that in the first embodiment. Next, as shown in FIG. 6a, the first insulating film 315 having an opening of which the width Y is 70 μm is formed on the surface of the nitride semiconductor growth layer 1000 using an electron beam evaporation method. In order to form this opening, in the same manner as that in the first embodiment, first, a resist pattern, having an opening for the region where the first insulating film 315 is formed, is formed using a photolithographic technique before the vapor deposition. Subsequently, the first insulating film 315 is evaporated on the entirety of the surface of the wafer using an electron beam evaporation method in the state where the resist pattern remains. After the vapor deposition, the first insulating film 315 evaporated on the resist pattern is removed together with the resist pattern by means of lift off. As a result, the first insulating film 315 remains in the opening of the resist pattern; thus, the form shown in FIG. 6a is obtained.

Figure 6D:
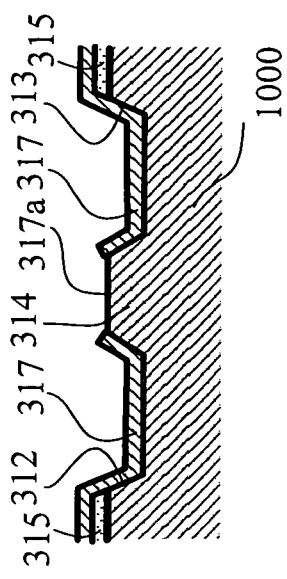
FIGS. 6a to 6e are schematic cross sectional views illustrating a manufacturing method of a part of the nitride semiconductor laser device according to the third embodiment of the present invention.
Figure 6E:
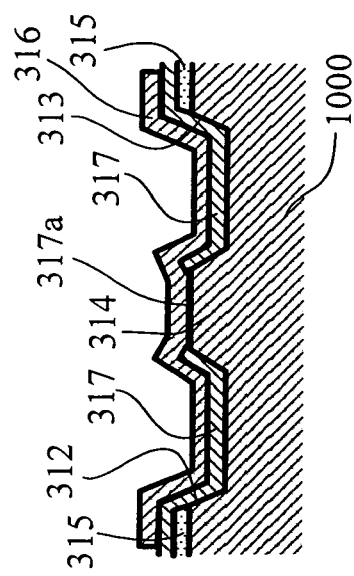
Figure 6A:
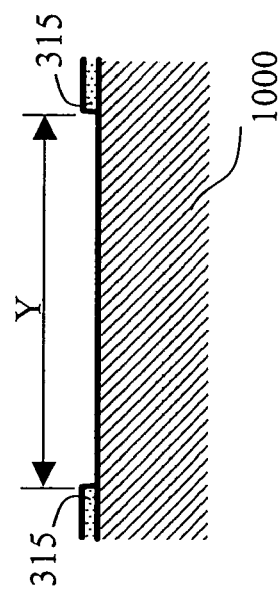
Figure 6B:
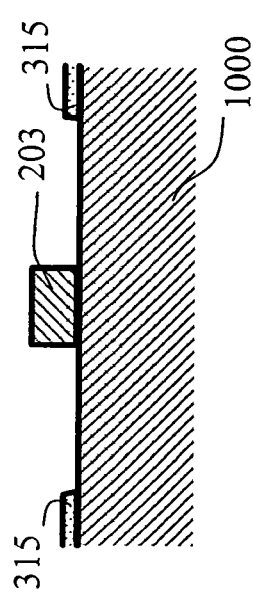
Figure 6C:
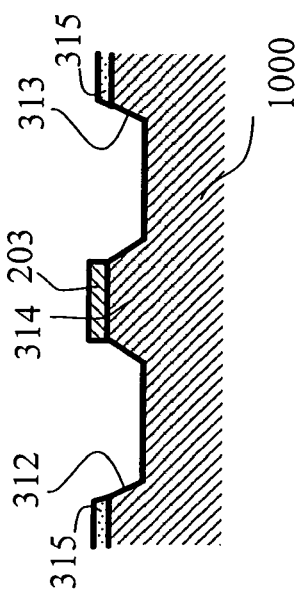

Next, as shown in FIG. 6b, a photoresist mask 203 having a width of 1.5 μm is formed in the center of the opening in the first insulating film 315. Then, as shown in FIG. 6c, etching is carried out on the nitride semiconductor growth layer 1000 as deep as the middle of the p-type AlGaN clad layer 108 using the first insulating film 315 and the photoresist mask 203 as a mask in accordance with an RIE technique, so that the trenches 312 and 313 and the ridge 314 are formed. At this time, chlorine-based gas such as $Cl_2$, $SiCl_4$ or $BCl_3$ may be used as process gas for the etching.

Next, the second insulating film 317 made of $SiO_2$ is evaporated on the entire surface of the wafer in accordance with an electron beam evaporation method and, thereafter, the second insulating film 317 evaporated on the surface of the photoresist mask 203 immediately above the ridge 314 is removed together with the photoresist mask 203 at the same time by means of lift off in the same manner as described above. As a result, the opening 317a is formed as shown in FIG. 6b.

Starting from the nitride semiconductor growth layer 1000 side, Pd (layer thickness: 20 nm) and Au (layer thickness: 150 nm) sequentially evaporated in accordance with an electron beam evaporation method on the wafer that has been obtained as described above over the ridge 314 and the trenches 312 and 313 as shown in FIG. 6e, so that the p-side electrode 316 is formed. Thus, the formation of the p-side electrode 316 on a specific portion can be carried out through the formation of a resist mask in accordance with a photolithographic technique before the vapor deposition and removal of the resist mask by means of lift off after the vapor deposition in the manner as described above.

Grinding and polishing is carried out on the rear surface of the n-type GaN substrate 100 of the wafer that has been obtained as described above until the thickness of the wafer becomes approximately 80 μm. Next, starting from the substrate side, Ti (layer thickness: 25 nm) and Al (layer thickness: 150 nm) are sequentially evaporated on the rear surface of the n-type GaN substrate 100 in accordance with an electron beam evaporation method, so that the n-side electrode 117 is formed. Thereafter, the gold wire 119 is connected to the top of the p-side electrode 316 in the region on the side opposite to the ridge 314 relative to the trench 312; thus, the nitride semiconductor laser device is obtained. This nitride semiconductor laser device is different from the nitride semiconductor laser device of FIG. 3 in that the first insulating film 315 is formed only on one side in the nitride semiconductor laser device of FIG. 3 whereas the first insulating film 315 is formed on both the left and right sides symmetrical relative to the ridge 314 located in the center in the aforementioned nitride semiconductor laser device.

In the nitride semiconductor laser device according to this embodiment, the photoresist mask 203 utilized upon formation of the ridge 314 by means of RIE is removed together with the second insulating film 317 evaporated thereon by means of lift off, so that the opening 317a is formed above the ridge 314. Therefore, the variation in the width of the opening 317a is greatly decreased in comparison with the nitride semiconductor laser devices according to the first and second embodiments where a wet etching technique is used. In addition, since the first insulating film 315 having a thickness of 600 nm is formed, the ridge 314 is formed at a position lower than its surroundings.

In the manufacturing method of a nitride semiconductor laser device according to this embodiment, the first insulating film 315 is used as a mask upon formation of the trenches 312 and 313 and the ridge 314 and, also, reduces damage that occurs when the gold wire 119 is joined to the p-side electrode 316 and prevents the generation of a current leakage path accompanying the damage. In addition, the process can be simplified in comparison with the methods according to the first and second embodiments where the mask is removed after the formation of the trenches 112 and 113 and the ridge 114, and thereafter, the insulating film 115 is formed.

According to this embodiment as described above, a wet etching method where etching is carried out isotropically and the etching rate and the like cannot be controlled well or a dry etching method where damage occurs due to ion impact and the like as a result of exposure to plasma is not utilized as means for providing an opening on the top of the ridge. Therefore, the current-voltage characteristics, the threshold value of the current for oscillation, the oscillation mode and the like of the nitride semiconductor laser device can be prevented from negatively affected as a result of an increase in the variation in the width of the opening 317a due to the variation of the etching rate. In addition, the surface of the ridge 314 does not receive damage from the ion impact or the like, so that an increase in the operation voltage and a reduction in the reliability of the nitride semiconductor laser device can be prevented from occurring as a result of damage due to the ion impact.

Fourth Embodiment

Figure 4:
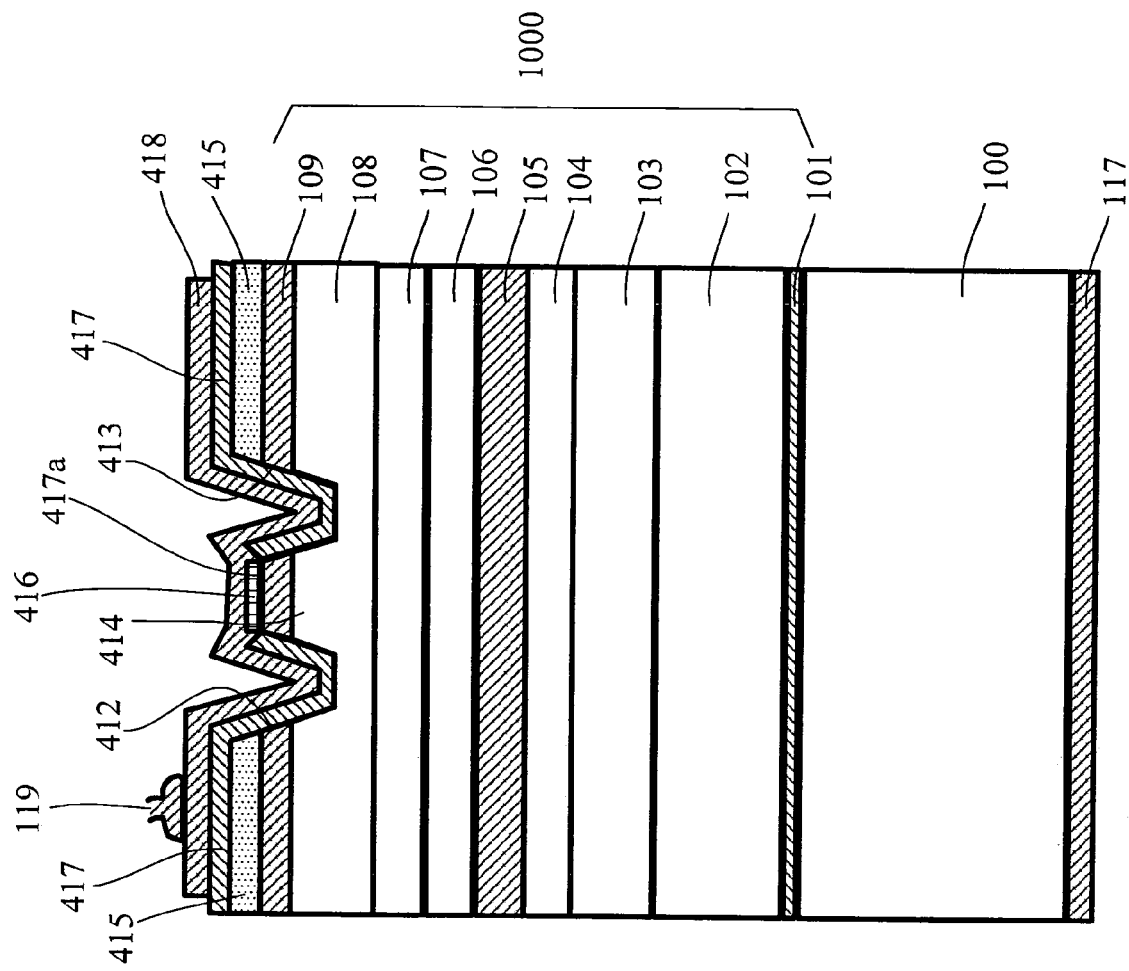
FIG. 4 is a schematic cross sectional view showing the configuration of a nitride semiconductor laser device according to a fourth embodiment of the present invention.

A fourth embodiment of the present invention will be described with reference to the drawings. FIG. 4 is a schematic cross sectional view showing the structure of a nitride semiconductor laser device according to this embodiment. Here, the configuration of a nitride semiconductor growth layer 1000 layered on an n-type GaN substrate 100 according to this embodiment is the same as that in the first embodiment; therefore, the detailed description thereof will not be given and the first embodiment should be referred to if necessary.

The nitride semiconductor laser device of FIG. 4 has the nitride semiconductor growth layer 1000 formed on the n-type GaN substrate 100 in the same manner as that in the first embodiment. The nitride semiconductor laser device also includes trenches 412 and 413 each having a width of 40 μm, a ridge 414 having a width of 1.5 μm, a first insulating film 415 which is made of $SiO_2$ and has a thickness of 600 nm, a first p-side electrode 416, a second insulating film 417 which is made of $SiO_2$ and has a thickness of 350 nm, an opening 417a having a width of 1.5 μm, a second p-side electrode 418, an n-side electrode 117 and a gold wire 119.

The trenches 412 and 413 are provided in the upper layer portion of the p-type AlGaN clad layer 108 and in the p-type GaN contact layer 109 so as to extend linearly in parallel to each other in the direction of [1-100] of the nitride semiconductor layer, and the ridge 414 is formed between these trenches 412 and 413. The first insulating film 415 made of $SiO_2$ is provided on the surface of the nitride semiconductor growth layer 1000 on the two sides which are opposite to the ridge 414 relative to the trenches 412 and 413, respectively. In addition, the second insulating film 417 made of $SiO_2$ is formed on the surface of the trenches 412 and 413, the ridge 414 and the first insulating film 415. Furthermore, the opening 417a is formed in the second insulating film 417 above the ridge 414.

In addition, the first p-side electrode 416 made of Pd (layer thickness: 15 nm) which has approximately the same width of this ridge 414 is provided on the surface of the ridge 414 and makes an ohmic contact with the p-type GaN contact layer 109 above the ridge 414 through the opening 417a formed in the second insulating film 417.

In addition, Au (layer thickness: 300 nm) is evaporated on the respective surfaces of the second insulating film 417 and the first p-side electrode 416 over the first p-side electrode 416 and the trenches 412 and 413, so that the second p-side electrode 418 is formed. Furthermore, the gold wire 119 is connected to the top of the second p-side electrode 418. In addition, starting from the n-type GaN substrate 100 side, Ti (layer thickness: 25 nm) and Al (layer thickness: 150 nm) are sequentially evaporated on the rear surface of the n-type GaN substrate 100, so that the n-side electrode 117 is formed.

Hereinafter, a fabricating method of a nitride semiconductor laser device will be described with reference to the drawings. FIGS. 7a to 7f are schematic cross sectional views showing the manufacturing method of the nitride semiconductor laser device according to this embodiment.

Figure 7A:
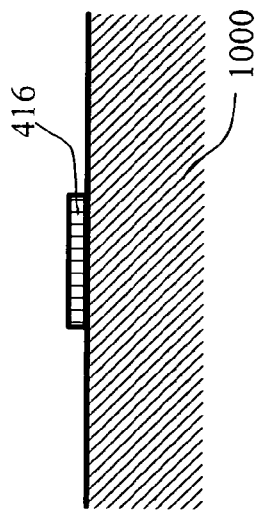
FIGS. 7a to 7f are schematic cross sectional views illustrating a manufacturing method of a part of the nitride semiconductor laser device according to the fourth embodiment of the present invention.

First, the nitride semiconductor growth layer 1000 is layered on the n-type GaN substrate 100 in the same manner as that in the first embodiment. Next, as shown in FIG. 7a, Pd (layer thickness: 15 nm) is evaporated on the surface of the nitride semiconductor growth layer 1000 in accordance with an electron beam evaporation method, so that the first p-side electrode layer 416 in stripe form having a width of 20 μm is formed.

In order to form the first p-side electrode layer 416 in stripe form, first, Pd is evaporated on the entirety of the surface of the nitride semiconductor growth layer 1000, and then, a conventional photolithographic technique is used to form a photoresist pattern having a width of 20 μm. Thereafter, Pd in the portion of the opening that is not coated with the photoresist is removed using a wet etching technique. Such wet etching is carried out by submerging the wafer in a solution where hydrochloric acid, nitric acid and pure water are mixed in the volume ratio of 1:9:5 for approximately 20 seconds.

Figure 7B:
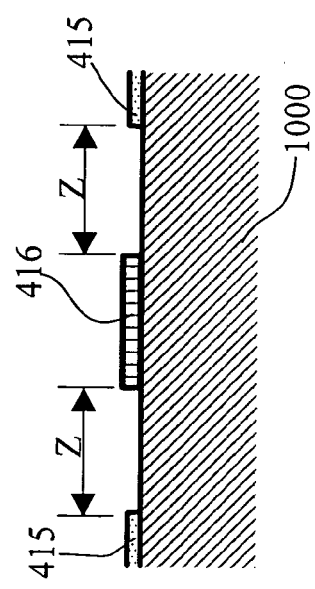

Next, as shown in FIG. 7b, the first insulating film 415 made of $SiO_2$ is formed on the entire surface of the nitride semiconductor growth layer 1000, except immediately on the first p-side electrode 416 and on the regions each of which has the width Z of 30 μm on both sides of the first p-side electrode 416, in accordance with an electron beam evaporation method.

Figure 7C:
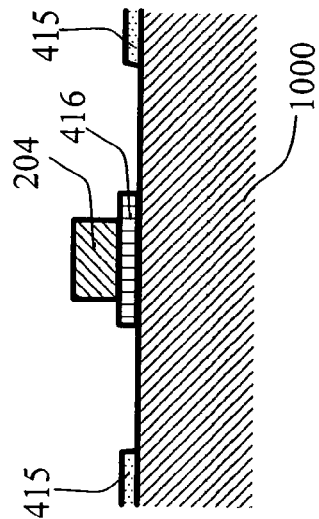
Figure 7D:
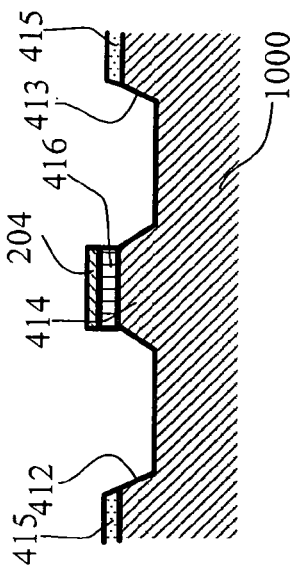

Next, as shown in FIG. 7c, a conventional photolithographic technique is used to form a photoresist mask 204 having a width of 1.5 μm on the surface of the first p-side electrode 416. Subsequently, etching is carried out on the first p-side electrode layer 416 and the nitride semiconductor growth layer 1000 as deep as the middle of the p-type AlGaN clad layer 108, using the photoresist mask 204 and the first insulating film 415 as a mask and using an RIE technique, so that the trenches 412 and 413 and the ridge 144 are formed as shown in FIG. 7d. Here, upon etching the first p-side electrode 416, mixed gas may be used, where etching gas such as Ar, $CF_4$ or $CHF_3$ and additive chlorine-based gas such as $Cl_2$, $SiCl_4$ or $BCl_3$ of which the volume ratio in a range from 0% to approximately 50% are mixed. In addition, upon etching the nitride semiconductor growth layer 1000, chlorine-based gas such as $Cl_2$, $SiCl_4$ or $BCl_3$ may be used.

Figure 7E:
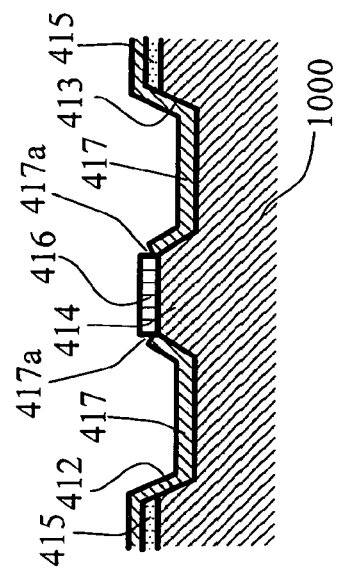

Furthermore, the second insulating film 417 made of $SiO_2$ is evaporated in accordance with an electron beam evaporation method on the entire surface of the wafer that has been obtained as described above, and thereafter, the photoresist mask 204 on which the second insulating film 417 immediately above the ridge 414 is evaporated is removed in accordance with a lift off method; thus, the opening 417a shown in FIG. 7e is obtained.

Figure 7F:
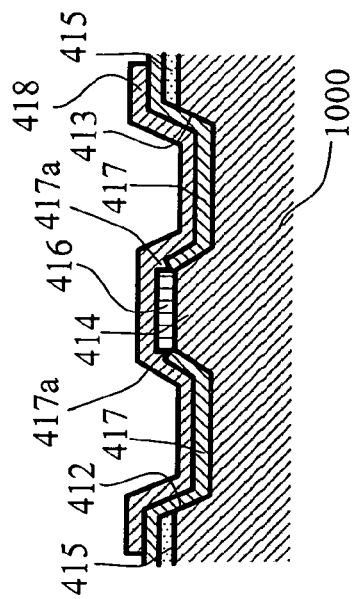

Subsequently, as shown in FIG. 7f, the second p-side electrode 418 made of Au (layer thickness: 300 nm) is formed in accordance with an electron beam evaporation method over the first p-side electrode 416 and the trenches 412 and 413. Such a formation of the second p-side electrode 418 on a specific portion is carried out, as described above, through the formation of a resist mask by means of a photolithographic technique before the vapor deposition and the removal of the resist mask by means of lift off after the vapor deposition.

Grinding and polishing is carried out on the rear surface of the n-type GaN substrate 100 of the wafer that has been obtained in this manner until the thickness of the wafer becomes approximately 80 μm. Next, starting from the substrate side, Ti (layer thickness: 25 nm) and Al (layer thickness: 150 nm) are sequentially evaporated on the rear surface of the n-type GaN substrate 100 in accordance with an electron beam evaporation method, so that the n-side electrode 117 is formed. Thereafter, the gold wire 119 is connected to the region of the second p-side electrode 418 on the side opposite to the ridge 414 relative to the trench 412 or 413, so that a nitride semiconductor laser device shown in FIG. 4 is obtained.

The manufacturing method of a nitride semiconductor laser device according to this embodiment does not have the step of coating the surface of the semiconductor layer of the ridge 414 directly with a photoresist mask or an insulating film since the first p-side electrode 416 is initially formed. Therefore, the occurrence of a residue on the surface of the nitride semiconductor layer as a result of undergoing the coating step as that in the first, second and third embodiments of the present invention can be suppressed and the possibility of deterioration in the current-voltage characteristics and the reliability of the nitride semiconductor laser device caused by such a residue can be reduced. In addition, in the same manner as that in the other embodiments, damage from the electrode is controlled by increasing the total thickness of the insulating film, so that the generation of a current leakage path in the first insulating film 415 and the second insulating film 417 can be suppressed.

Here, in each embodiment of the present invention, the layer which is provided in order to suppress the generation of a current leakage path caused by damage from the joint portion in the case where wire bonding of a gold wire or the like is carried out on the upper electrode in order to make an electrical connection to the outside is the second p-side electrode 118 made of Au having a thickness of 600 nm in the first embodiment (FIG. 1), the second p-side electrode 215 which is made of $SiO_2$ and has a thickness of 700 nm in the second embodiment (FIG. 2), the first p-side electrode 315 which is made of $SiO_2$ and has a thickness of 600 nm in the third embodiment (FIG. 3) and the first insulating film 415 which is made of $SiO_2$ and has a thickness of 600 nm in the fourth embodiment (FIG. 4), but the thickness of each of these layers is not limited to the aforementioned value. In addition, in the case where the device is mounted on a submount, or the like, with the p-side electrode facing downward, it is desirable for the ridge to be positioned 300 nm or more closer to the n-type GaN substrate 100 side than the surface of the p-side electrode that becomes the joint surface, because an unevenness of approximately 250 nm exists on the surface of the submount which is, for example, made of Cu so as to have excellent heat radiating properties.

In this specification, the term "nitride semiconductor" includes semiconductors where Ga in gallium nitride (GaN) is partially replaced with another group III element, for example, $Ga_sAl_tIn_{1-s-t}N$ ($0<s\leq1, 0\leq t<1, 0<s+t\leq1$) and, also, includes semiconductors where the respective component atoms are partially replaced with impurity atoms and semiconductors to which impurities are added.

In addition, the first p-side electrode 116 according to the first embodiment (FIG. 1) of the present invention, the p-side electrode 216 according to the second embodiment (FIG. 2) and the p-side electrode 316 according to the third embodiment (FIG. 3) are electrodes made of Pd having a thickness of 20 nm and Au having a thickness of 150 nm sequentially evaporated in this order starting from the nitride semiconductor growth layer 1000 side. However, the electrode material is not limited thereto, and Ni, Ti or the like may be used, or a metal such as Au or Mo may be layered on the surface of the electrode in the structure. Furthermore, the thickness of each layer is not limited to the aforementioned values.

In addition, the first p-side electrode is Pd having a thickness of 15 nm and the second p-side electrode is Au having a thickness of 300 nm according to the fourth embodiment of the present invention (FIG. 4). However, the electrode materials are not limited thereto, and Ni, Ti or the like may be used for the respective electrodes, and in addition, the electrodes may have a layered structure of a plurality of metals where metal such as Au or Mo is layered on the surface thereof. Furthermore, the thicknesses are not limited to the aforementioned values.

In addition, $SiO_2$ is used as the insulating film material in each embodiment of the present invention. However, the insulating film material is not limited thereto, and other inorganic dielectrics such as $TiO_2$, SiO, $Ta_2O_5$ and SiN, as well as gallium nitride-based compound semiconductors such as AlGaN may be used. Furthermore, the thickness thereof is not limited to the value in each of the aforementioned embodiments. Moreover, the method for forming the insulating film is not limited to the electron beam evaporation method used in each of the aforementioned embodiments, and other film formation methods such as a sputtering method and a plasma CVD method may be used.

In addition, the dry etching technique that is utilized in each of the embodiments of the present invention is an RIE technique. However, the present invention is not limited thereto, and an RIBE (Reactive Ion Beam Etching) technique, a sputter etching technique and the like may be used.

According to the present invention, the thickness of the sum of the insulator film and the upper electrode layer in a region to which a wire is connected is larger than the thickness of the other regions. Therefore, a highly reliable nitride semiconductor laser device can be realized which is not negatively affected by damage that occurs in the joint portion between the wire and the upper electrode, even in the case where wire bonding or the like is carried out on the upper electrode by using a wire made of gold or the like in order to make an electrical connection to the outside and where no current leakage path is generated.

Particularly in the case where the insulator film instead of the upper electrode layer is formed to be thick, ultrasonic energy can be sufficiently applied to the joint portion when wire bonding or the like is carried out on the upper electrode using a wire made of gold or the like in accordance with a ball bonding method in order to obtain an electrical connection to the outside, so that the joint can be prevented from losing strength.

In the manufacturing method of the nitride semiconductor laser according to the present invention, an insulator film can be used as a mask when a pair of trenches and a ridge are formed using an etching technique. Therefore, it becomes unnecessary to remove this insulator film after the etching has been carried out; thus, this manufacturing process can be simplified.

In the manufacturing method of the nitride semiconductor laser according to the present invention, the surface of a ridge is masked using a resist pattern; therefore, this resist pattern can be simply lifted off upon providing an opening on the top of the ridge. Accordingly, a wet or dry etching method does not necessarily have to be used as means for providing an opening on the top of the ridge. Therefore, the current-voltage characteristics, the threshold current value for oscillation, the oscillation mode, and the like, of the nitride semiconductor laser device can be prevented from being negatively affected by an increase in the variation of the width of the opening due to the variation of the etching rate, and in addition, an increase in the operation voltage and reduction in reliability of the nitride semiconductor laser device can be prevented even when the surface of the ridge receives damage from the ion impact and the like.

In the manufacturing method of the nitride semiconductor laser according to the present invention, the surface of the ridge may not be coated with a photoresist mask, an insulating film or the like, since the upper electrode has been initially formed on top of the ridge on the surface of the nitride semiconductor growth layer. Therefore, the occurrence of a residue on the surface of the nitride semiconductor layer accompanying the step of the coating can be prevented, and the possibility of deterioration of the current voltage characteristics as well as the reduction in reliability of the nitride semiconductor laser device caused by a residue can be reduced.

What is claimed is:

1. A nitride semiconductor laser device comprising:
   a substrate;
   a nitride semiconductor growth layer having a plurality of nitride semiconductor layers layered on the substrate;
   a pair of trenches in the surface of the nitride semiconductor growth layer;
   a ridge interposed between the pair of trenches and provided with an opening;
   an insulator film formed on the surface of the nitride semiconductor growth layer having an opening on the ridge; and
   an upper electrode layer formed over the surfaces of the insulator film and the ridge, wherein
   the upper electrode layer includes a first electrode layer formed over the surfaces of the insulator film and the ridge and a second electrode layer formed in a region outside of the pair of trenches in the surface of the first electrode layer,
   an electrical contact point is provided outside of the pair of trenches on the surface of the second electrode layer so as to make an electrical connection to the outside, and
   the thickness between the surface of the upper electrode layer in the electrical contact point and the nitride semiconductor growth layer is larger than the thickness between the upper electrode layer immediately above the ridge and the nitride semiconductor growth layer.

2. The nitride semiconductor laser device according to claim 1, wherein the insulator film includes:
   a first insulator film formed on the surface of the nitride semiconductor growth layer except for the ridge; and
   a second insulator film formed in a region which is at least a part of a region outside of the pair of trenches in the surface of the first insulator film.

3. The nitride semiconductor laser device according to claim 1, wherein the insulator film includes:
   a first insulator film formed in a region which is at least a part of a region outside the pair of trenches in the surface of the nitride semiconductor growth layer; and
   a second insulator film formed over the surface of the first insulator film and the nitride semiconductor growth layer except for the ridge.

4. The nitride semiconductor laser device according to claim 1, wherein the insulator film includes:
   a first insulator film formed in a region which is at least a part of a region outside of the pair of trenches in the surface of the nitride semiconductor growth layer; and a second insulator film formed over the surface of the first insulator film and the nitride semiconductor growth layer except for the ridge, and the first electrode layer formed on the surface of the opening of the ridge.

5. The nitride semiconductor laser device according to claim 1, wherein the ridge is formed in a position which is closer to the substrate than the electrical contact point by 300 nm or more.

6. A manufacturing method of a nitride semiconductor laser device, comprising:

a first step of forming a pair of trenches in the surface of a nitride semiconductor growth layer having a plurality of nitride semiconductor layers layered on a substrate, and a ridge interposed between the pair of trenches;

a second step of forming an insulator film on the surface of the nitride semiconductor growth layer where the pair of trenches and the ridge are formed;

a third step of removing the insulator film layered on the ridge to form an opening;

a fourth step of forming an upper electrode layer over the surfaces of the insulator film and the opening, wherein
a first electrode layer is formed over the surfaces of the insulator film and the ridge, and a second electrode layer is formed in a region on the surface of the first electrode layer outside of the pair of trenches; and a fifth step of providing an electrical contact point outside of the pair of trenches in the surface of the second electrode layer so as to make an electrical connection to the outside, wherein the insulator film and the upper electrode layer are formed in such a manner that the thickness between the surface of the upper electrode layer in the electrical contact point and the nitride semiconductor growth layer is larger than the thickness between the upper electrode layer immediately above the ridge and the nitride semiconductor growth layer.

7. The manufacturing method of a nitride semiconductor laser device according to claim 6, wherein a first insulator film is formed on the surface of the nitride semiconductor growth layer except for the ridge, and a second insulator film is formed in a region which is at least a part of a region on the surface of the first insulator film outside of the pair of trenches, when the insulator film is formed in the second step.

8. The manufacturing method of a nitride semiconductor laser device according to claim 6, wherein a first insulator film is formed on the surface of the nitride semiconductor growth layer in a part of a region except for a region where the pair of trenches and the ridge are to be formed, and the pair of trenches and the ridge are formed by using the first insulator film as a part of a mask in the first step, and the insulator film is formed of the first insulator film and the second insulator film by forming a second insulator film over the surface of the first insulator film and the nitride semiconductor growth layer except for the ridge in the second step.

9. The manufacturing method of a nitride semiconductor laser device according to claim 6, wherein in the second step, the second insulator film is formed over the surface of the first insulator film and the surface of the nitride semiconductor growth layer including the surface of the resist pattern as a mask upon formation of the ridge in the first step, and in the third step, the resist pattern immediately above the ridge is removed together with the second insulator film formed on the resist pattern, so that the opening is formed.

10. A manufacturing method of a nitride semiconductor laser device which comprises a substrate, a nitride semiconductor growth layer having a plurality of nitride semiconductor layers layered on the substrate, a pair of trenches in the surface of the nitride semiconductor growth layer, and a ridge interposed between the pair of trenches, the method comprising;

a first step of providing a first electrode layer of the surface of the nitride semiconductor growth layer in a region where the ridge is to be formed and, also, forming a first insulator film in a region which is at least a part of a region outside of the region where the pair of trenches are to be formed;

a second step of forming a resist pattern in stripe form on the surface of the first electrode layer and, also, forming the pair of trenches and the ridge using the resist pattern and the first insulator film as a part of a mask;

a third step of forming a second insulator film over the surface of the first insulator film and the surface of the nitride semiconductor growth layer including the surface of the resist pattern used as a mask upon formation of the ridge in the second step and, also, removing the resist pattern immediately above the ridge together with the second insulator film formed on the resist pattern, thereby forming an opening;

a fourth step of forming a second electrode layer over at least one of the surfaces of the second insulator film outside a pair of trenches; and a fifth step of providing an electrical contact point outside of the pair of trenches in the surface of the second electrode layer so as to make an electrical connection to the outside, wherein the thickness between the surface of the second electrode layer in the electrical contact point and the nitride semiconductor growth layer is larger than the thickness between the second electrode layer immediately above the ridge and the nitride semiconductor growth layer.

* * * * *